(12) United States Patent
Kuno et al.

(10) Patent No.: US 12,463,023 B2
(45) Date of Patent: Nov. 4, 2025

(54) MEMBER FOR SEMICONDUCTOR MANUFACTURING APPARATUS

(71) Applicant: NGK INSULATORS, LTD., Nagoya (JP)

(72) Inventors: Tatsuya Kuno, Nagoya (JP); Seiya Inoue, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 80 days.

(21) Appl. No.: 18/584,006

(22) Filed: Feb. 22, 2024

(65) Prior Publication Data

US 2025/0069865 A1 Feb. 27, 2025

Related U.S. Application Data

(63) Continuation of application No. PCT/JP2023/029982, filed on Aug. 21, 2023.

(51) Int. Cl.
*H01J 37/32* (2006.01)

(52) U.S. Cl.
CPC .. *H01J 37/32724* (2013.01); *H01J 37/32642* (2013.01)

(58) Field of Classification Search
None
See application file for complete search history.

(56) References Cited

U.S. PATENT DOCUMENTS

| 5,529,657 A | 6/1996 | Ishii |
| 6,494,955 B1 | 12/2002 | Lei et al. |

(Continued)

FOREIGN PATENT DOCUMENTS

| JP | H07-106316 A | 4/1995 |
| JP | 2000-173988 A | 6/2000 |

(Continued)

OTHER PUBLICATIONS

Korean Office Action (with English translation) dated Mar. 25, 2025 (Application No. 10-2024-7008757).

(Continued)

*Primary Examiner* — Alexander H Taningco
(74) *Attorney, Agent, or Firm* — BURR PATENT LAW, PLLC (57) ABSTRACT

A member for semiconductor manufacturing apparatus includes a ceramic plate including a horizontal and circular wafer placement surface, and a horizontal and annular focus ring placement surface provided on an outer circumference of the wafer placement surface at a position lower than the wafer placement surface by one step, and a connection part that connects the wafer placement surface and the focus ring placement surface; and a cooling plate provided on a lower surface of the ceramic plate, wherein the connection part has a lateral surface of a circular truncated cone with a diameter that increases from the wafer placement surface to the focus ring placement surface, and the diameter of the upper surface of the circular truncated cone matches the outer diameter of the wafer placement surface, and the diameter of the lower surface of the circular truncated cone matches the inner diameter of the focus ring placement surface.

6 Claims, 4 Drawing Sheets

(56) References Cited

U.S. PATENT DOCUMENTS

| | | | |
|---|---|---|---|
| 2003/0013315 A1* | 1/2003 | Park | H01J 37/32431 156/345.31 |
| 2011/0126852 A1 | 6/2011 | Dhindsa et al. | |
| 2016/0289827 A1* | 10/2016 | Augustyniak | C23C 16/52 |
| 2018/0182635 A1 | 6/2018 | Tsukahara et al. | |
| 2023/0055928 A1 | 2/2023 | Takebayashi et al. | |
| 2023/0143327 A1* | 5/2023 | Han | H01J 37/32807 156/345.53 |
| 2024/0200191 A1* | 6/2024 | Gage | C23C 16/45521 |

FOREIGN PATENT DOCUMENTS

| | | |
|---|---|---|
| JP | 2002-093894 A | 3/2002 |
| JP | 2009-152232 A | 7/2009 |
| JP | 2013-512564 A | 4/2013 |
| JP | 2016-195108 A | 11/2016 |
| JP | 2016-207979 A | 12/2016 |
| JP | 2018-107433 A | 7/2018 |
| JP | 2019-169699 A | 10/2019 |
| JP | 2023-027641 A | 3/2023 |
| KR | 10-2023-0067308 A | 5/2023 |

OTHER PUBLICATIONS

International Search Report and Written Opinion (Application No. PCT/JP2023/029982) dated Oct. 31, 2023 (9 pages).

* cited by examiner

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

A member for semiconductor manufacturing apparatus is used to perform CVD and etching on a wafer using plasma. For example, the member for semiconductor manufacturing apparatus disclosed in PTL 1 includes a ceramic plate, and a cooling plate provided on the lower surface of the ceramic plate. The ceramic plate includes a circular wafer placement surface provided on the upper surface, and an annular focus ring placement surface provided on an outer circumference of the wafer placement surface at a position lower than the wafer placement surface by one step. A connection part that connects the wafer placement surface and the focus ring placement surface has a lateral surface perpendicular to the wafer placement surface. A focus ring placed on the focus ring placement surface includes a step along the inner circumference of the upper end so as not to interfere with the wafer. The wafer on the wafer placement surface is placed thereon in a state of being overhung on the wafer placement surface.

CITATION LIST

Patent Literature

PTL 1: JP 2023-27641 A

SUMMARY OF THE INVENTION

When a wafer is processed using such a member for semiconductor manufacturing apparatus, the wafer receives heat input from plasma, but the wafer is cooled by the cooling plate. However, when the outer circumferential portion of the wafer is in a state of being overhung on the wafer placement surface, the outer circumferential portion may not be cooled sufficiently, and may have a high temperature locally.

The present invention has been devised to solve the above-mentioned problem, and it is a main object to increase the capability of cooling the outer circumferential portion of a wafer.

[1] A member for semiconductor manufacturing apparatus of the present invention includes: a ceramic plate including a circular wafer placement surface, and an annular focus ring placement surface provided on an outer circumference of the wafer placement surface at a position lower than the wafer placement surface by one step; and a cooling plate provided on a lower surface of the ceramic plate. A connection part that connects the wafer placement surface and the focus ring placement surface has a lateral surface of a circular truncated cone with a diameter that increases from the wafer placement surface to the focus ring placement surface.

In the member for semiconductor manufacturing apparatus, the connection part that connects the wafer placement surface and the focus ring placement surface has the lateral surface of a circular truncated cone with a diameter that increases from the wafer placement surface to the focus ring placement surface (in other words, from an upper position to a lower position). Thus, as compared to when the lateral surface of the connection part is perpendicular to the wafer placement surface, thermal paths from the outer circumferential portion of the wafer placement surface to the cooling plate increase in number. Therefore, the capability of cooling the outer circumferential portion of the wafer is improved.

Here, "the lateral surface of a circular truncated cone" refers not only to the case of the lateral surface of a circular truncated cone in a strict sense, but also the case where the lateral surface of a circular truncated cone has a projection or the case where the lateral surface of a circular truncated cone has a recess (the same applies below).

[2] In the member for semiconductor manufacturing apparatus (the member for semiconductor manufacturing apparatus according to [1]) of the present invention, the diameter of the wafer placement surface may be smaller than the diameter of a wafer to be placed. In this case, particularly the outer circumferential portion of the wafer is likely to have a high temperature, thus application of the present invention has high significance.

[3] In the member for semiconductor manufacturing apparatus (the member for semiconductor manufacturing apparatus according to [1] or [2]) of the present invention, the angle of the lateral surface of the connection part with respect to the focus ring placement surface may be 70° or less. With this setting, thermal paths from the outer circumferential portion of the wafer placement surface to the cooling plate can be sufficiently increased in number.

[4] The member for semiconductor manufacturing apparatus (the member for semiconductor manufacturing apparatus according to any one of [1] to [3]) of the present invention may include a focus ring placed on the focus ring placement surface, and part of the inner circumferential surface of the focus ring, the part being opposed to the lateral surface of the connection part, may be a lateral surface of a circular truncated cone with a diameter that increases from an upper position to a lower position. For example, when the wafer placed on the wafer placement surface is disposed so as to cover the inner circumferential portion of the focus ring from above, the inner circumferential portion of the focus ring is more likely to be cooled than other portions because the inner circumferential portion receives no heat input from plasma. However, the part, opposed to the lateral surface of the connection part, of the inner circumferential surface of the focus ring is a lateral surface of a circular truncated cone with a diameter that increases from an upper position to a lower position, thus heat removal by the cooling plate is low. As a result, it is possible to prevent excessive cooling of the inner circumferential portion of the focus ring which is likely to be cooled in general.

[5] In the member for semiconductor manufacturing apparatus (the member for semiconductor manufacturing apparatus according to [4]) of the present invention, the angle of the part with respect to the focus ring placement surface may be greater than the angle of the lateral surface of the connection part with respect to the focus ring placement surface. With this setting, the gap between the lateral surface of the connection part of the ceramic plate and the part, opposed to the lateral surface of the connection part, of the inner circumferential surface of the focus ring is greater at a higher position, thus it is easy to prevent the focus ring from coming into contact with the ceramic plate.

[6] In the member for semiconductor manufacturing apparatus (the member for semiconductor manufacturing apparatus according to [4]) of the present invention, the angle of the part with respect to the focus ring placement surface may be less than the angle of the lateral surface of the connection part with respect to the focus ring placement surface. With this setting, the contact area between the lower surface of the inner circumferential side of the focus ring and the focus ring placement surface can be made sufficiently small, thus it is possible to more effectively prevent excessive cooling of the inner circumferential portion of the focus ring which is likely to be cooled in general.

DETAILED DESCRIPTION OF THE INVENTION

Figure 1:
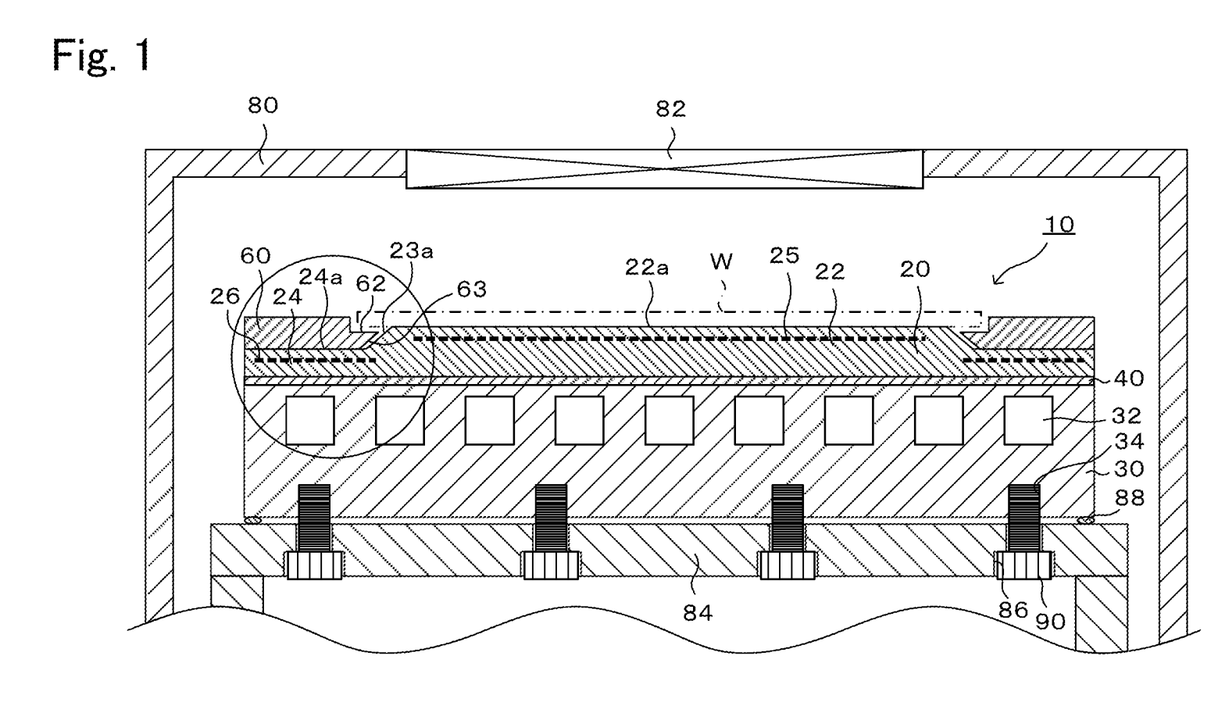
FIG. 1 is a vertical cross-sectional view of a member 10 for semiconductor manufacturing apparatus.
Figure 2:
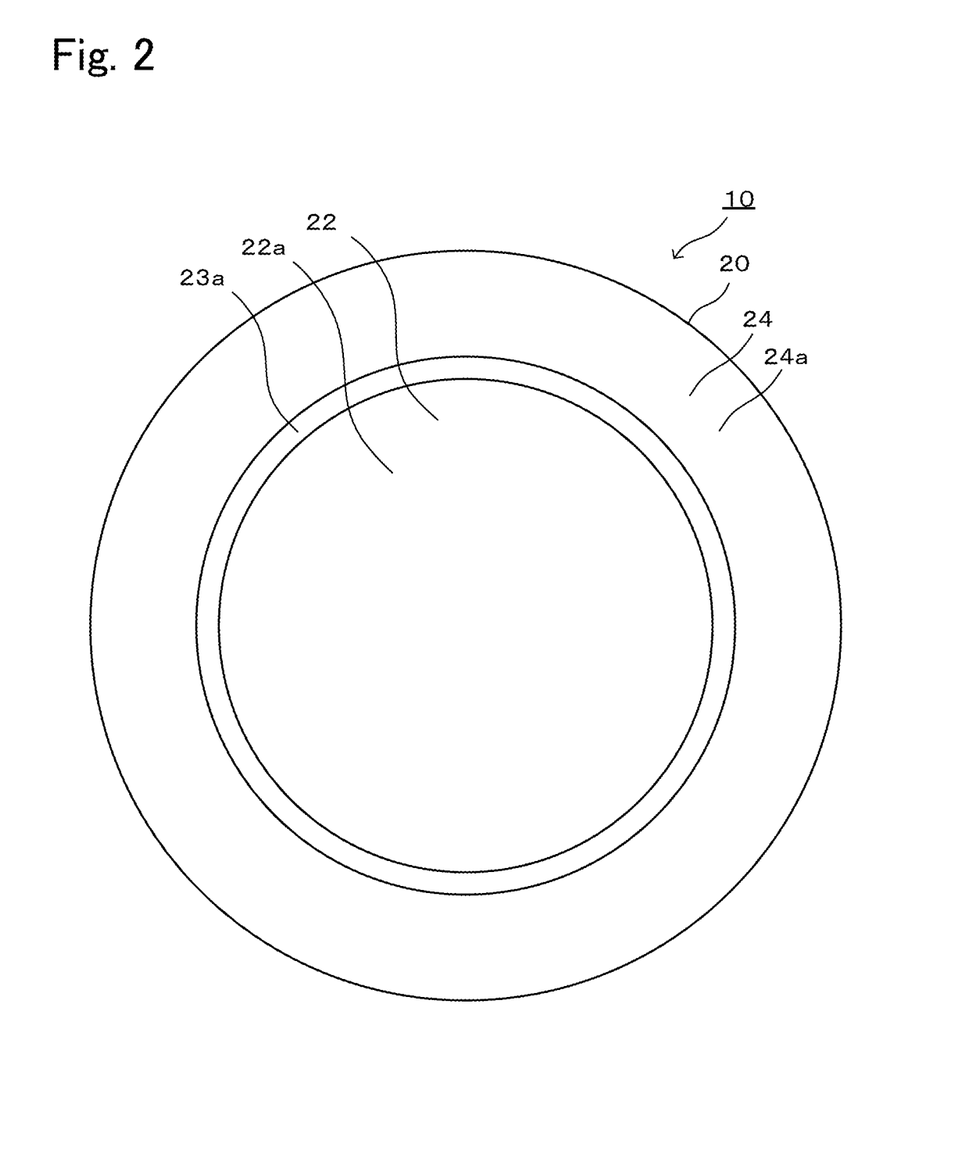
FIG. 2 is a plan view of the member 10 for semiconductor manufacturing apparatus.
Figure 3:
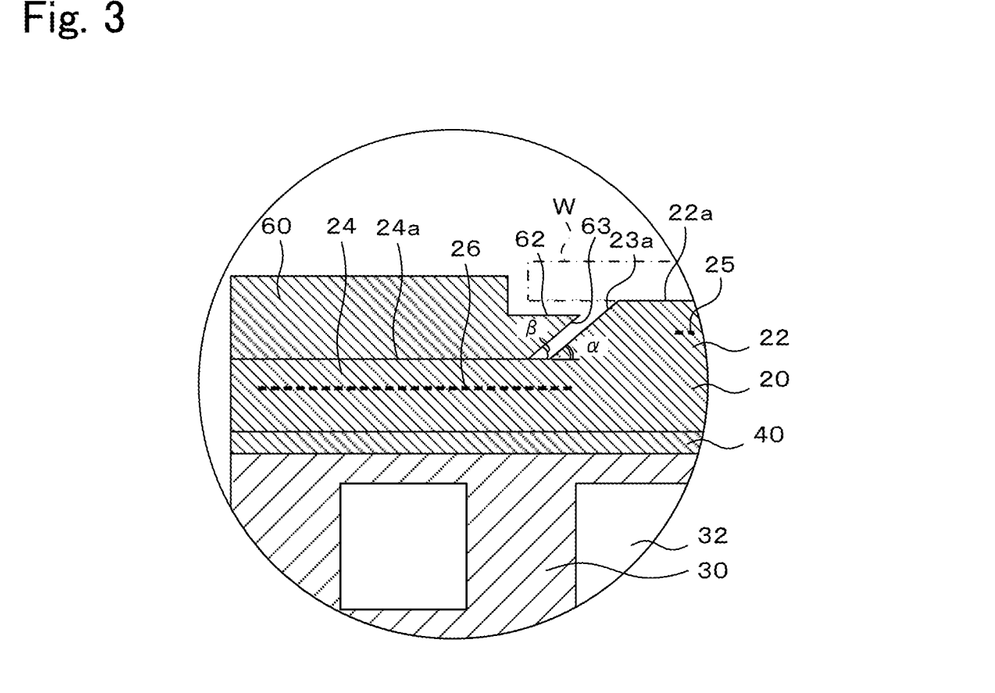
FIG. 3 is a partial enlarged view of FIG. 1.

A preferred embodiment of the present invention will be described with reference to the drawings below. FIG. 1 is a vertical cross-sectional view (a cross-sectional view when a member 10 for semiconductor manufacturing apparatus is cut by a plane including the central axis of the member 10) of a member 10 for semiconductor manufacturing apparatus, FIG. 2 is a plan view of the member 10 for semiconductor manufacturing apparatus, and FIG. 3 is a partial enlarged view (an enlarged view of the portion surrounded by the circle in FIG. 1) of FIG. 1. In the following, a description is given using the upper and lower, the right and left, the front and back, however, the upper and lower, the right and left, the front and back indicate only a relative positional relationship.

The member 10 for semiconductor manufacturing apparatus is to be used for performing CVD and etching on a wafer W by utilizing and plasma, and is fixed to an installation plate 84 provided inside a chamber 80 for semiconductor process. The member 10 for semiconductor manufacturing apparatus includes a ceramic plate 20, a cooling plate 30, a bonding layer 40, and a focus ring 60. Hereinafter, the "focus ring" is abbreviated as "FR".

The ceramic plate 20 includes a circular wafer placement surface 22a, and an annular FR placement surface 24a provided on the outer circumference of the wafer placement surface 22a at a position lower than the wafer placement surface 22a by one step. The wafer W is placed on the wafer placement surface 22a, and a FR 60 is placed on the FR placement surface 24a. The ceramic plate 20 is made of a ceramic material represented by alumina, aluminum nitride. The ceramic plate 20 is formed in a shape so that a circular truncated cone 22 is stacked on the upper surface of a flat cylindrical portion 24. The upper surface of the circular truncated cone 22 of the ceramic plate 20 is the wafer placement surface 22a, and the annular surface of the upper surface of the cylindrical portion 24, excluding the circular truncated cone 22 is the FR placement surface 24a. The circular truncated cone 22 is also a connection part that connects the wafer placement surface 22a and the FR placement surface 24a. Thus, the connection part has the lateral surface (tapered surface 23a) of the circular truncated cone with a diameter that increases from the wafer placement surface 22a to the FR placement surface 24a. Angle α (see FIG. 3) of the tapered surface 23a with respect to the FR placement surface 24a may be less than 90°, preferably 80° or less, and more preferably 70° or less. The lower limit of the angle α is not particularly restricted, and it is preferable that the angle α be 20° or greater. When the angle α is 20° or greater, the leading end of the FR 60 does not become too acute, which is preferable because the possibility of cracking or the like of the FR 60 is reduced. The diameter of the wafer placement surface 22a is smaller than the diameter (e.g., 300 mm) of the wafer W.

The circular truncated cone 22 of the ceramic plate 20 has a built-in wafer attraction electrode 25. The wafer attraction electrode 25 is made of a material containing e.g., W, Mo, WC, MoC. The wafer attraction electrode 25 is a disk-shaped or mesh-shaped monopolar electrostatic electrode. The layer of the ceramic plate 20, above the wafer attraction electrode 25 functions as a dielectric layer. The wafer attraction electrode 25 is connected to a wafer attraction DC power supply which is not illustrated.

The cylindrical portion 24 of the ceramic plate 20 has a built-in FR attraction electrode 26. The FR attraction electrode 26 is buried at a position of the cylindrical portion 24, the position being opposed to the FR placement surface 24a. The FR attraction electrode 26 is made of a material containing e.g., W, Mo, WC, MoC. The FR attraction electrode 26 is an annular-shaped or mesh-shaped monopolar electrostatic electrode. The layer of the ceramic plate 20, above the FR attraction electrode 26 functions as a dielectric layer. The FR attraction electrode 26 is connected to an FR attraction DC power supply which is not illustrated.

The cooling plate 30 is a disk member internally including a refrigerant flow path 32 through which a refrigerant can be circulated. The refrigerant flow path 32 is formed from one end to the other end in a one-stroke pattern to cover the entire surface of the ceramic plate 20 in a plan view. In the present embodiment, the diameter of the cooling plate 30 is the same as the diameter of the lower surface of the ceramic plate 20. The refrigerant which flows through the refrigerant flow path 32 is preferably liquid, and preferably has electrical insulating properties. As liquid having electrical insulating properties, e.g., fluorine-based inert liquid may be mentioned. The cooling plate 30 is made of e.g., a conductive material containing metal. As the conductive material, e.g., metal and a composite material may be mentioned. As the metal, Al, Ti, Mo or an alloy thereof may be mentioned. As the composite material, metal matrix composite material (MMC) and a ceramic matrix composite material (CMC) may be mentioned. As a specific example of such a composite material, a material containing Si, SiC and Ti, and a material obtained by impregnating a SiC porous body with Al and/or Si may be mentioned. The material containing Si, SiC and Ti is referred to as SiSiCTi, the material obtained by impregnating a SiC porous body with Al is referred to as AlSiC, and the material obtained by impregnating a SiC porous body with Si is referred to as SiSiC. As the material for the cooling plate 30, a material having a coefficient of thermal expansion closer to that of the material for the ceramic plate 20 is preferably selected. The cooling plate 30 is also used as an RF electrode. A protective film made of an insulating material (e.g., alumina or yttria) may be formed on the outer circumferential surface of the cooling plate 30.

The bonding layer 40 bonds the lower surface of the ceramic plate 20 and the upper surface of the cooling plate 30. In the present embodiment, the bonding layer 40 is an organic adhesive layer. As the organic adhesive layer, resin such as, acrylic resin, silicone resin, and epoxy resin, may be used. In addition to the resin, a filler may be contained.

The FR 60 is an annular member placed on the FR placement surface 24*a*, and is made of e.g., silicon. The upper portion of the inner circumferential surface of the FR 60 is provided with a step 62 in a circumferential direction. The step 62 is provided to prevent the wafer W from interfering with the FR 60. Part 63 of the inner circumferential surface of the FR 60, the part 63 being opposed to the tapered surface 23*a* is the lateral surface (tapered surface) of a circular truncated cone with a diameter that increases from an upper position to a lower position. The part 63 is not in contact with the tapered surface 23*a*. In other words, a gap is formed between the part 63 and the tapered surface 23*a*. Thus, the FR 60 is unlikely to be thermally affected by the circular truncated cone 22 of the ceramic plate 20. In the present embodiment, the angle β (see FIG. 3) of the part 63 with respect to the FR placement surface 24*a* is the same as the angle α of the tapered surface 23*a* with respect to the FR placement surface 24*a*.

Next, an example of use of the member 10 for semiconductor manufacturing apparatus will be described with reference to FIG. 1. The chamber 80 has a shower head 82 in a ceiling surface. The member 10 for semiconductor manufacturing apparatus is fixed to the installation plate 84 disposed inside the chamber 80. Specifically, O-ring 88 having substantially the same diameter as the diameter of the cooling plate 30 is disposed between the lower surface of the cooling plate 30 and the upper surface of the installation plate 84, and the installation plate 84 and the cooling plate 30 are secured by a plurality of bolts 90 in this state, thus the member 10 for semiconductor manufacturing apparatus is fixed to the installation plate 84. Each bolt 90 has a head and a foot. The bolt 90 is inserted from below into a bolt insertion hole 86 with a step, the bolt insertion hole 86 vertically penetrating the installation plate 84, and the foot is screwed into a threaded hole 34 provided in the lower surface of the cooling plate 30. At this point, the head of the bolt 90 is engaged with the step of the bolt insertion hole 86. The O-ring 88 is crushed vertically to exhibit a sealing property. When there is a point where the sealing property is necessary additionally, an O-ring is separately disposed at the point.

The FR 60 is placed on the FR placement surface 24*a* of the member 10 for semiconductor manufacturing apparatus, and the disk-shaped wafer W is placed on the wafer placement surface 22*a*. In this state, a DC voltage is applied to the wafer attraction electrode 25 to attract the wafer W to the wafer placement surface 22*a*, and a DC voltage is applied to the FR attraction electrode 26 to attract the FR 60 to the FR placement surface 24*a*. Setting is made so that a predetermined vacuum atmosphere (or a reduced pressure atmosphere) is created inside the chamber 80, and a high frequency voltage is applied between the shower head 82 and the cooling plate 30 while supplying a process gas from the shower head 82. Then, plasma is generated between the cooling plate 30 and the shower head 82. The wafer W is then processed using the plasma.

Note that as the wafer W is plasma-processed, the FR 60 is also worn out; however, the FR 60 is thicker than the wafer W, thus the FR 60 is replaced after several wafers W are processed.

When the wafer W is processed using the member 10 for semiconductor manufacturing apparatus, the wafer W receives heat input from plasma; however, the wafer W is cooled by the cooling plate 30. Since the diameter of the wafer W is greater than the diameter of the wafer placement surface 22*a*, the outer circumferential portion of the wafer W is in a state of being overhung from the wafer placement surface 22*a*. Thus, heat is unlikely to be conducted away from the outer circumferential portion of the wafer W by the cooling plate 30, and the outer circumferential portion is likely to have a high temperature. However, in the present embodiment, the connection part (the circular truncated cone 22) that connects the wafer placement surface 22*a* and the FR placement surface 24*a* has the lateral surface (tapered surface 23*a*) of the circular truncated cone with a diameter that increases from the wafer placement surface 22*a* to the FR placement surface 24*a*. Thus, as compared to when the lateral surface of the connection part is perpendicular to the wafer placement surface 22*a*, thermal paths from the outer circumferential portion of the wafer placement surface 22*a* to the cooling plate 30 increase in number.

Figure 4:
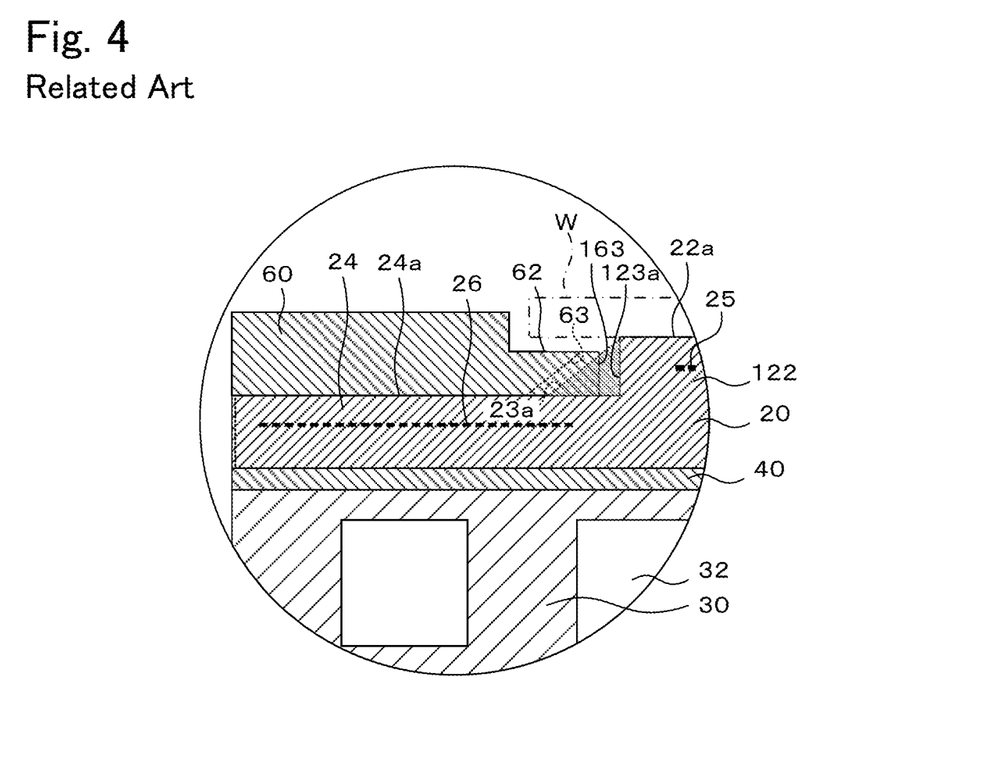
FIG. 4 is a partial enlarged view in a comparative embodiment.

This point will be described in detail below. FIG. 4 is a partial enlarged view of a comparative embodiment (an embodiment of a conventional technique disclosed in PTL 1). In FIG. 4, the ceramic plate 20 is formed in a shape so that a flat small-diameter cylindrical portion 122 is stacked on the upper surface of the flat cylindrical portion 24. The upper surface of the cylindrical portion 122 of the ceramic plate 20 is the wafer placement surface 22*a*. The cylindrical portion 122 is also the connection part that connects the wafer placement surface 22*a* and the FR placement surface 24*a*. The connection part has the lateral surface (perpendicular surface 123*a*) of the cylindrical portion 122. In addition, part 163 of the inner circumferential surface of the FR 60, the part 163 being opposed to the perpendicular surface 123*a* is also a perpendicular surface. Note that in FIG. 4, the same components as in the present embodiment are labeled with the same symbol. In FIG. 4, the tapered surface 23*a* and the part 63 in the present embodiment are shown by a dotted line. In the present embodiment, the connection part (the circular truncated cone 22) has the lateral surface (tapered surface 23*a*) of a circular truncated cone with a diameter that increases from the wafer placement surface 22*a* to the FR placement surface 24*a*, thus as compared to when the connection part (the cylindrical portion 122) has a perpendicular lateral surface (perpendicular surface 123*a*) as in the comparative embodiment, thermal paths from the outer circumferential portion of the wafer placement surface 22*a* to the cooling plate 30 increase in number. Specifically, the area of a right triangle cross section indicated by dot hatching in FIG. 4 shows the increased paths. Consequently, in the present embodiment, heat is easily removed from the outer circumferential portion where the wafer W is overhung as compared to the comparative embodiment.

The wafer W placed on the wafer placement surface 22*a* is disposed so as to cover the inner circumferential portion of the FR 60 from above. In this case, in the comparative embodiment of FIG. 4, the inner circumferential portion of the FR 60 covered by the wafer W is prevented from receiving heat input of plasma due to the wafer W, thus is likely to be cooled than other portions. However, in the present embodiment, the inner circumferential portion of the FR 60 covered by the wafer W has a shape so that part of the inner circumferential portion of the FR 60 in the comparative embodiment is diagonally cut off, thus heat removal by the cooling plate 30 is low. As a result, it is possible to prevent excessive cooling of the inner circumferential portion of the FR 60 which is likely to be cooled in general.

In the member 10 for semiconductor manufacturing apparatus described above, the connection part (the circular truncated cone 22) has the lateral surface of the circular truncated cone with a diameter that increases from the wafer placement surface 22a to the FR placement surface 24a, thus as compared to the comparative embodiment of FIG. 4, in which the connection part has perpendicular lateral surface (the perpendicular surface 123a), thermal paths from the outer circumferential portion of the wafer placement surface 22a to the cooling plate 30 increase in number. Therefore, the capability of cooling the outer circumferential portion of the wafer W is improved.

In addition, the diameter of the wafer placement surface 22a is smaller than the diameter of the wafer W placed. In this case, particularly the outer circumferential portion of the wafer W is likely to have a high temperature, thus application of the present invention has high significance.

Furthermore, the angle α of the tapered surface 23a with respect to the FR placement surface 24a is preferably 70° or less. In this manner, thermal paths from the outer circumferential portion of the wafer placement surface 22a to the cooling plate 30 can be sufficiently increased in number.

Furthermore, the part 63, opposed to the tapered surface 23a, of the inner circumferential surface of the FR 60 is the lateral surface of a circular truncated cone with a diameter that increases from an upper position to a lower position. Thus, it is possible to prevent excessive cooling of the inner circumferential portion of the FR 60 which is likely to be cooled in general.

In addition, the lateral surface of the connection part (the circular truncated cone 22) of the ceramic plate 20 as well as the part 63 of the inner circumferential surface of the FR 60 are tapered surfaces, thus when the FR 60 is placed on the FR placement surface 24a, the accuracy of the installation position of the FR 60 is improved by a self-alignment effect.

Note that the present invention is not limited to the above-described embodiment at all, and it is needless to say that the present invention can be carried out in various forms as long as the forms belong to the technical scope of the present invention.

Figure 5:
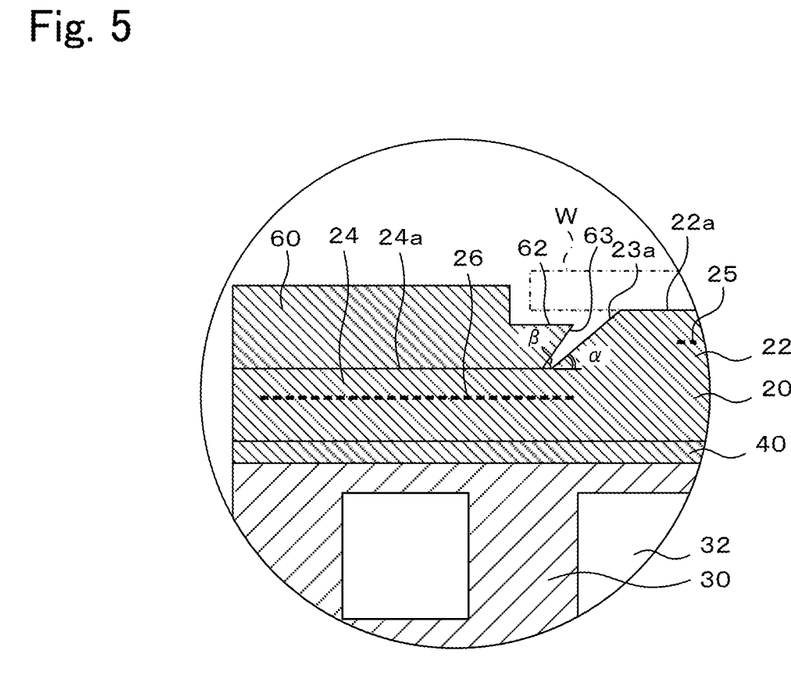
FIG. 5 is a partial enlarged view in another embodiment.
Figure 6:
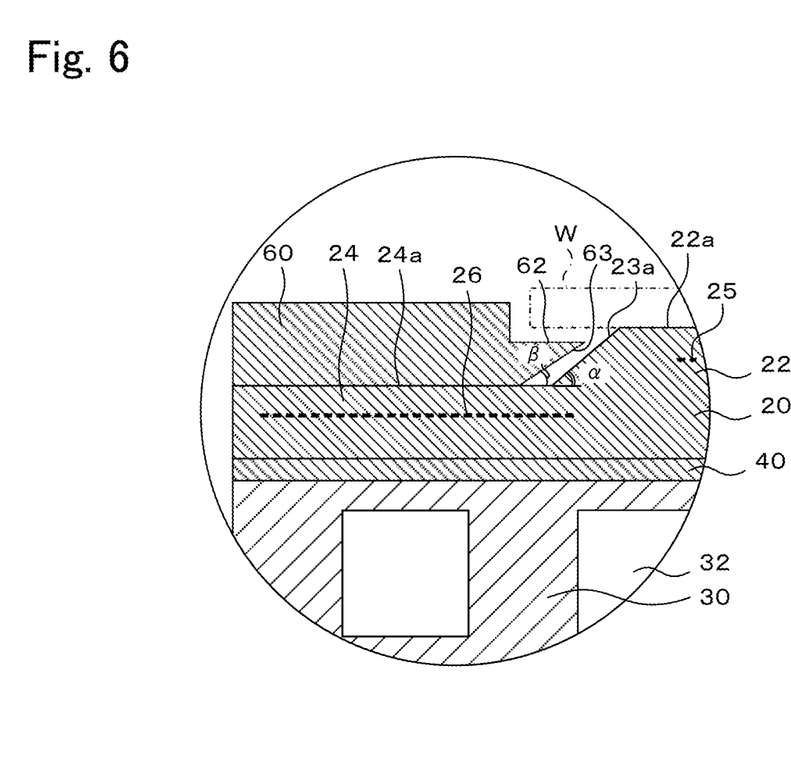
FIG. 6 is a partial enlarged view in another embodiment.

In the above-described embodiment, the angle α of the tapered surface 23a with respect to the FR placement surface 24a and the angle β of the part 63 (tapered surface) with respect to the FR placement surface 24a are set to be the same; however, without being limited to this, e.g., the configuration of FIG. 5 and FIG. 6 may be adopted. In FIG. 5 and FIG. 6, the same components as in the above-described embodiment are labeled with the same symbol.

In FIG. 5, the angle β of the part 63 (tapered surface) with respect to the FR placement surface 24a is greater than the angle α of the tapered surface 23a with respect to the FR placement surface 24a (that is, β>α). With this setting, the gap between the part 63 (tapered surface) of the FR 60 and the tapered surface 23a of the ceramic plate 20 is greater at a higher position, thus it is easy to prevent the part 63 (tapered surface) of the FR 60 from coming into contact with the ceramic plate 20.

In FIG. 6, the angle β of the part 63 (tapered surface) with respect to the FR placement surface 24a is smaller than the angle α of the tapered surface 23a with respect to the FR placement surface 24a (that is, β<α). With this setting, the contact area between the lower surface of the inner circumferential side of the FR 60 and the FR placement surface 24a can be made sufficiently small, thus it is possible to more effectively prevent excessive cooling of the inner circumferential portion of the FR 60 which is likely to be cooled in general.

In FIG. 5 and FIG. 6, the difference in these angles α, β is preferably 30° or less, and more preferably 15° or less. With this setting, it is possible to reduce the possibility of occurrence of another problem, such as electric discharge due to too much space between the part 63 of the FR 60 and the tapered surface 23a of the ceramic plate 20.

In the above-described embodiment, the tapered surface 23a of the ceramic plate 20, and the part 63, opposed to the tapered surface 23a, of the inner circumferential surface of the FR 60 are the lateral surface of a circular truncated cone in a strict sense, but is not particularly limited to thereto. For example, instead of the lateral surface of a circular truncated cone in a strict sense, the shape of a bulged lateral surface of a circular truncated cone may be adopted, or the shape of a depressed lateral surface thereof may be adopted. The same applies to the part 63.

In the above-described embodiment, a heater electrode for heating wafer may be buried in the circular truncated cone 22 of the ceramic plate 20. With this setting, when the wafer W placed on the wafer placement surface 22a needs to be heated to a high temperature, the wafer W can be heated to a desired high temperature by turning on the heater electrode for heating wafer. In addition, a heater electrode for heating FR may be buried in a position, opposed to the FR placement surface 24a, of the cylindrical portion 24 of the ceramic plate 20. With this setting, when the FR 60 placed on the FR placement surface 24a needs to be heated to a high temperature, the FR 60 can be heated to a desired high temperature by turning on the heater electrode for heating FR. When both the heater electrode for heating wafer and the heater electrode for heating FR are buried in the ceramic plate 20, it is preferable that temperature be independently adjustable by the respective heater electrodes.

In the above-described embodiment, an organic adhesive layer has been adopted as the bonding layer 40, but is not particularly limited thereto. For example, he bonding layer 40 may be an inorganic bonding layer such as metal layer. The inorganic bonding layer may be a metal bonding layer made of solder or metal brazing material (e.g., a brazing material such as aluminum or titanium). The metal bonding layer may be formed by e.g., TCB (Thermal compression bonding). The TCB is a publicly known method by which a metal bonding material is inserted between two members to be bonded, and the two members are pressurized and bonded with the two members heated at a temperature lower than or equal to the solidus temperature of the metal bonding material.

International Application No. PCT/JP2023/029982, filed on Aug. 21, 2023, is incorporated herein by reference in its entirety.

What is claimed is:
1. A member for semiconductor manufacturing apparatus, comprising:
    a ceramic plate including a horizontal and circular wafer placement surface, and a horizontal and annular focus ring placement surface provided on an outer circumference of the wafer placement surface at a position lower than the wafer placement surface by one step, and a connection part that connects the wafer placement surface and the focus ring placement surface; and
    a cooling plate provided on a lower surface of the ceramic plate,
    wherein the connection part has a lateral surface of a circular truncated cone with a diameter that increases from the wafer placement surface to the focus ring placement surface, and the diameter of the upper surface of the circular truncated cone matches the outer diameter of the wafer placement surface, and the diam- eter of the lower surface of the circular truncated cone matches the inner diameter of the focus ring placement surface.

2. The member for semiconductor manufacturing apparatus according to claim 1,
wherein a diameter of the wafer placement surface is smaller than a diameter of a wafer to be placed.

3. The member for semiconductor manufacturing apparatus according to claim 1,
wherein an angle of a lateral surface of the connection part with respect to the focus ring placement surface is 70° or less.

4. The member for semiconductor manufacturing apparatus according to claim 1, further comprising
a focus ring to be placed on the focus ring placement surface,
wherein part of an inner circumferential surface of the focus ring is a lateral surface of a circular truncated cone with a diameter that increases from an upper position to a lower position, the part being opposed to the lateral surface of the connection part.

5. The member for semiconductor manufacturing apparatus according to claim 4,
wherein an angle of the part with respect to the focus ring placement surface is greater than the angle of the lateral surface of the connection part with respect to the focus ring placement surface.

6. The member for semiconductor manufacturing apparatus according to claim 4,
wherein an angle of the part with respect to the focus ring placement surface is less than the angle of the lateral surface of the connection part with respect to the focus ring placement surface.

* * * * *